United States Patent
Schuster et al.

(10) Patent No.: US 6,996,141 B1
(45) Date of Patent: Feb. 7, 2006

(54) DEVICE FOR REDUCING THE PEAK POWER OF A PULSED LASER LIGHT SOURCE

(75) Inventors: Karl-Heinz Schuster, Königsbronn (DE); Harry Bauer, Aalen (DE); Eric Eva, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 459 days.

(21) Appl. No.: 09/588,261

(22) Filed: Jun. 6, 2000

(30) Foreign Application Priority Data

Jul. 8, 1999 (DE) .................................. 199 31 751

(51) Int. Cl.
*H01S 3/13* (2006.01)

(52) U.S. Cl. .................. 372/30; 372/25; 372/93; 372/94

(58) Field of Classification Search ............ 372/30, 372/25, 93, 108, 31; 362/268
See application file for complete search history.

(56) References Cited

U.S. PATENT DOCUMENTS

| | | | | |
|---|---|---|---|---|
| 4,918,751 A | * | 4/1990 | Pessot .................. 455/608 |
| 4,941,093 A | | 7/1990 | Marshall et al. |
| 5,233,460 A | * | 8/1993 | Partlo ................. 359/247 |
| 5,309,456 A | * | 5/1994 | Horton ................. 372/25 |
| 5,315,604 A | * | 5/1994 | Chiu ................... 372/25 |
| 5,329,398 A | * | 7/1994 | Lai ..................... 359/566 |
| 5,337,333 A | * | 8/1994 | Daly .................... 372/94 |
| 5,349,591 A | * | 9/1994 | Weston ................. 372/25 |
| 5,559,816 A | | 9/1996 | Basting et al. |
| 5,661,748 A | * | 8/1997 | Zahavi ................ 372/108 |
| 6,180,913 B1 | * | 1/2001 | Kolmeder et al. ..... 219/121.68 |
| 6,238,063 B1 | * | 5/2001 | Tanitsu et al. ........ 362/268 |
| 6,389,045 B1 | * | 5/2002 | Mann et al. ........... 372/25 |
| 6,437,284 B1 | * | 8/2002 | Okamoto et al. ...... 219/121.73 |

FOREIGN PATENT DOCUMENTS

| | | |
|---|---|---|
| EP | 0 785 473 A2 | 1/1997 |
| GB | GB A * | 1/1968 |
| GB | 1098897 * | 1/1968 |

OTHER PUBLICATIONS

1098897.*

* cited by examiner

*Primary Examiner*—Minsun Oh Harvey
*Assistant Examiner*—Dung T. Nguyen
(74) *Attorney, Agent, or Firm*—Welsh & Katz, Ltd.

(57) ABSTRACT

In a device for reducing the peak power of a pulsed laser light source, in particular for a projection exposure system, there is arranged in the beam path (1) at least one beam splitter apparatus (3, 4) by means of which a detour line (5 or 11) is produced, via reflecting components (6, 7, 8 or 12, 13, 14) for at least one partial beam (1*b*) with subsequent recombination at a beam recombining element (9 or 15) with the other partial beam or beams (1*b* or 10*b*) to form a total beam.

44 Claims, 3 Drawing Sheets

DEVICE FOR REDUCING THE PEAK POWER OF A PULSED LASER LIGHT SOURCE

DESCRIPTION

Device for Reducing the Peak Power of a Pulsed Laser Light Source

The invention relates to a device for reducing the peak power of a pulsed laser light source, in particular for a projection exposure system.

Pulsed laser light sources, for example excimer lasers, for UV lithography have a repetition rate of approximately 1000 to 4000 pulses per second. The pulse length is currently 20 to 30 ns. Depending on the gas state, or the state of the laser, in particular of the optical components, and depending on the resonator length, substantial modulations of the laser output power occur over time within every pulse.

It has emerged in practice in this case that a clear disadvantage of a pulsed laser light source consists in that the short pulse duration causes a high pulse power density which has a very negative effect on the optical materials, in particular vitreous materials. In the case of an operating wavelength of 193 nm, quartz glass is damaged at a rate containing one power of the power density. The consequences of this are transmission losses and an uncontrolled increase in the refractive index, which limits the service life of the optical system. There are points with particularly weak bonds in the case of $SiO_2$ in vitreous form. The pulsed shortwave electromagnetic beams generated by the pulsed laser light source therefore supply the energy in order to modify these points disadvantageously.

EP 0 785 473 A2 discloses a device of the type mentioned at the beginning by means of which the light coming from a pulsed laser light source is spread into a plurality of partial beams which traverse detour lines. This produces a beam expansion or a splitting into a plurality of partial beams arranged next to one another. These partial beams are input into an illuminating apparatus in a fashion arranged next to one another.

However, it is a disadvantage in this case that a plurality of optical axes are thereby produced next to one another, and the illuminating apparatus has to be correspondingly adapted. Moreover, the afore-mentioned device is of fixed alignment.

U.S. Pat. No. 5,661,748 describes a pulse-retarding apparatus with semitransparent mirrors and a positive "tail" of the pulse distribution, and an arrangement with two concave mirrors and a dissected mirror in which an offset (part 4.2) occurs in principle which is not produced by the oblique passage through plane plates.

It is therefore the object of the present invention to create a device with the aid of which damage is avoided to components which are situated in the beam path of the pulsed laser light source, specifically as far as possible without particular losses in the efficiency of the pulse laser light source.

This object is achieved according to the invention by means of the measures named in the characterizing part of claim 1.

According to the invention, the high peaks of the pulsed laser light source are now lowered and the pulse power density is reduced, specifically in conjunction with only low integral energy losses. The beam splitting in conjunction with the detour line splits the beam of the pulsed laser light source into partial beams having an optical path difference. In this case, it need only be ensured that the optical path difference is selected such that peaks and valleys at least largely complement one another. Peaks and valleys are spaced apart in time, for example 7.0 ns. This corresponds to a light path of 2.1 m. In order to halve the pulse power density of whole pulses, they are split into a plurality of pulses and then lined up in terms of time. In order to produce as large as possible a reduction in the peaks inside a pulse and a largely uniform power density, it is proposed in an advantageous refinement of the invention to arrange at least two detour lines in series in the beam path.

According to the invention, it is not the case that a plurality of partial beams are produced which are arranged juxtaposed with a corresponding number of optical axes; rather, the partial beams are reunited to form a total beam, the result being to provide a unified optical axis for the downstream illuminating apparatus. Finally, rethreading takes place after the division into a plurality of partial beams.

In a particularly advantageous way, the device according to the invention can be used to influence polarized light, for which purpose an angle, preferably the Brewster angle, is correspondingly provided between the beam path and the beam splitter apparatus. As a result of the Brewster angle, 50% (apart from absorption in the splitter layer) of the beam passes unhindered and without loss through the beam splitter apparatus, for example a mirror, while the other 50% is dissipated. Of course, however, yet other angles and thereby also yet other percentage splits are possible within the scope of the invention.

In a further refinement of the invention, it can be provided that the beam recombining element is constructed such that a portion of the partial beam which has run via the detour line is repeatedly sent via the detour line.

It is possible in this way to achieve yet more optical path differences, and thus an even stronger degree of uniformity. Additional losses from the mirror and splitter also come to bear, of course.

A phase-retarding plate in the beam path influences the power peaks and the service life of the optical materials which are exposed to the pulsed laser light source.

Further advantageous refinements and developments follow from the remaining subclaims and from the exemplary embodiment described below in principle with the aid of the drawing, in which:

Figure 1:
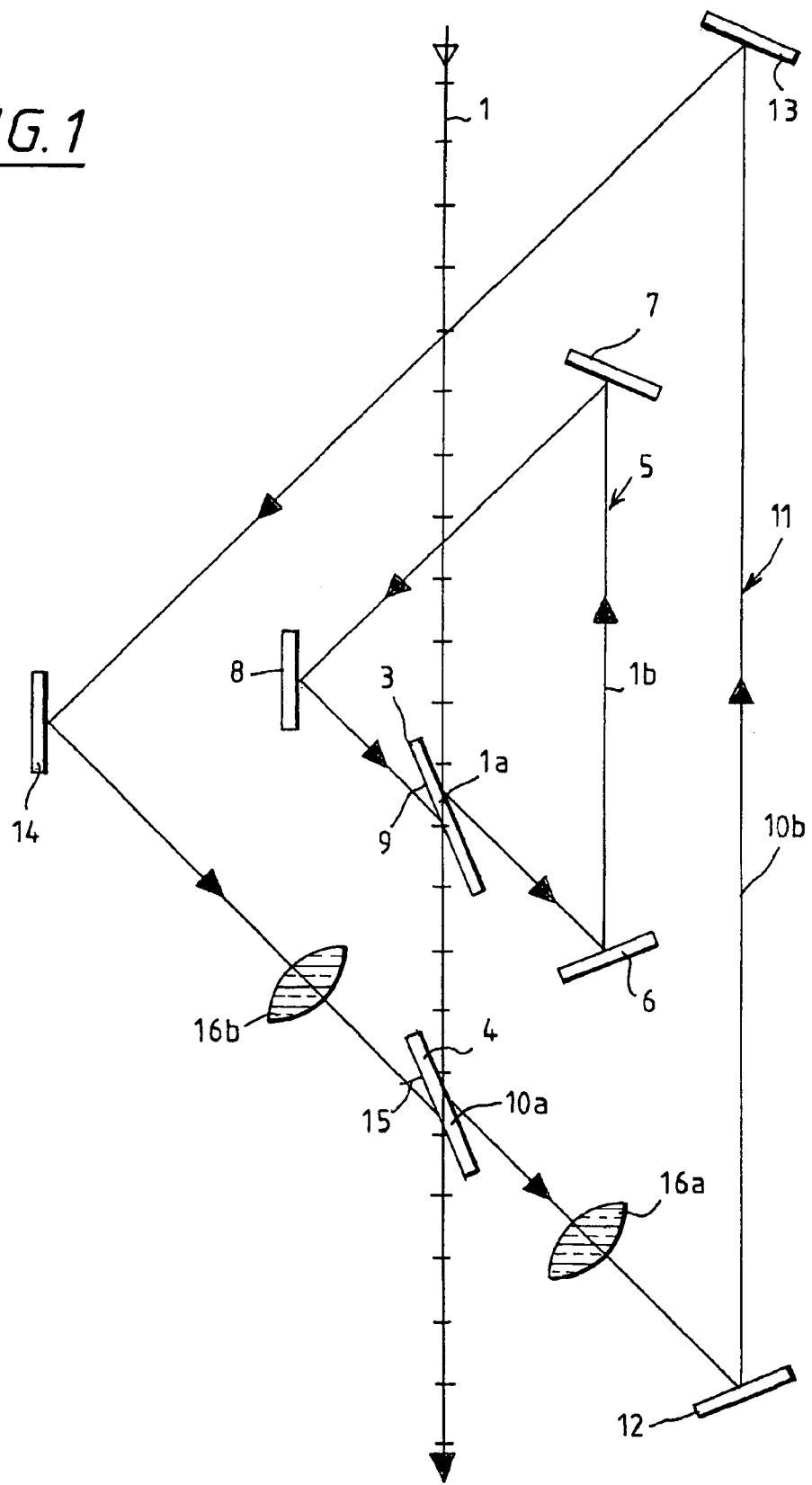
FIG. 1 shows an illustration of the principle of the beam path of a pulsed laser light source having two detour lines.

In accordance with the illustration in FIG. 1, a beam 1 from a pulsed laser light source, for example an excimer laser 2 (illustrated in FIG. 5) strikes a first beam splitter apparatus in the form of a mirror 3. 50% of the total beam passes the splitter mirror 3 as partial beam 1a without hindrance or loss in the direction of a second splitter mirror 4 as second beam splitter apparatus. The other 50% of the beam passes as partial beam 1b via a detour line 5, which is formed by three mirrors 6, 7 and 8 as reflecting members. The splitter mirror 3 as first beam splitter apparatus also acts, on its rear side, simultaneously as beam recombining element 9 in which the partial beam 1b is reunited with the partial beam 1a passing through the beam splitter apparatus. The pulse of the pulsed laser light source 2 is inherently smoothed by the first detour line 5. At the same time, in this case the peak power is reduced by 30 to 40%. Because of the angular position of the splitter mirror 3 and the first detour line 5 relative to the direction of oscillation of the incident linearly polarized laser light, the level of the degree of polarization plays no role in the energy balance. Both partial beams 1a and 1b are equally polarized at the output of the first detour line 5, but are offset in time.

Figure 2:
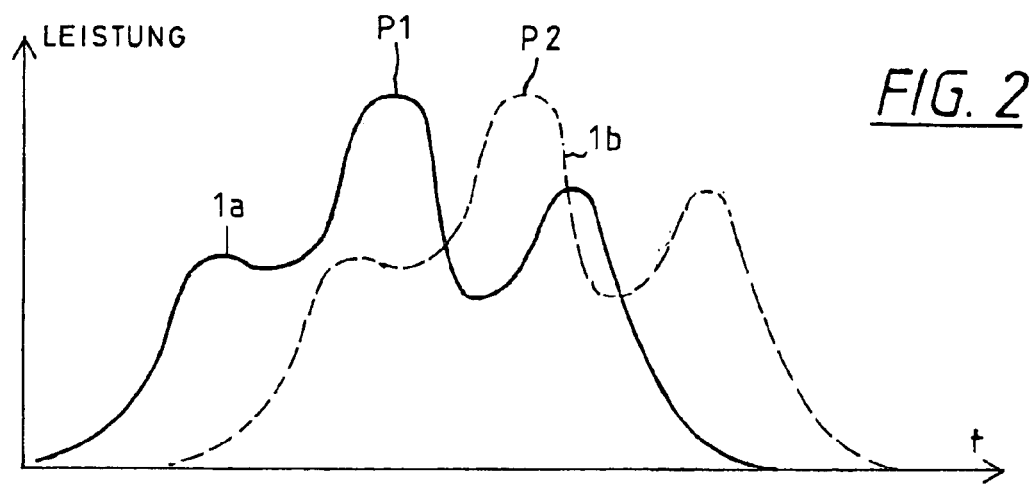
FIG. 2 shows the power of the pulsed laser light source in the state split by a first detour line.

The temporal offset of the two partial beams 1a and 1b can be seen from FIG. 2. As may be seen, because of the temporal offset of the two peaks $P_1$ and $P_2$, in the event of addition the peak power of the pulsed laser light source, which has been reduced to half in each case because of the beam splitting, is reduced correspondingly in the total peak resulting therefrom by comparison with an untreated beam path.

After the reuniting of the two partial beams 1a and 1b in the further beam path by the second beam splitter apparatus in the form of the splitter mirror 4, which is, in turn, situated rotated by 45° (Brewster angle) relative to the direction of oscillation of the laser light, the laser light beam is split into the partial beam 10a, which passes the splitter mirror 4 without hindrance, and the partial beam 10b, which is sent via a second detour line 11. The second detour line 11 is likewise formed by mirrors 12, 13 and 14 as reflecting members. The rear side of the beam splitter 4 serves, in turn, as second beam recombining element 15, through which the two partial beams 10a and 10b are recombined in conjunction with the same direction of polarization and subsequently passed on jointly.

The pulse of the pulsed laser light source 2 is offset as a whole by the second detour line 11, which can have a path of 11.1 m, for example. This produces at the output or at the beam recombining element 15 two pulses of the same polarization which are largely smoothed or no longer have impermissibly high peaks which could lead to damage to members.

Figure 3:
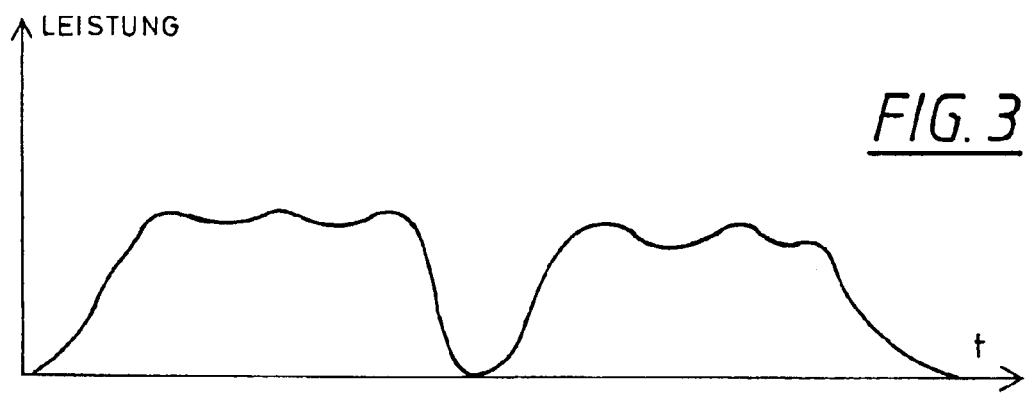
FIG. 3 shows the power characteristic of the pulsed laser light source in accordance with a second detour line.

FIG. 3 shows the power against time and the two pulses such as are present downstream of the beam recombining element 15. The original power peaks can be reduced in this case to approximately a third of the original value. If, for example, the time duration of the pulse of the pulsed laser light source is 30 ns, this corresponds to a light path of 9 m. If, in accordance with the exemplary embodiment, the first detour line 5 is combined with the second detour line 11, there is once a delay of 2.1 m and the pulse smoothed in this way is delayed 9.0 m +2.1 m, that is to say a total of 11.1 m, in the second detour line 11.

Regions between the laser output and a scanner input are best suited for the measures according to the invention.

The particular advantage of the invention resides in the fact that the downstream illuminating unit need not be specially designed, but that the proposed apparatus can be inserted only between the laser output and the input of the illuminating part of a scanner. This also makes it possible economically to retrofit existing systems (no new illuminating part of the scanner).

If the beam quality of the pulsed laser light source is degraded by the different path lengths, it can be reconstituted, for example, by means of an easily detuned Kepler telescope (somewhat adapted to the excimer laser divergence in the individual case) with its two lenses 16a and 16b—as indicated in FIG. 1 in the second detour line 11. A single lens also comes into consideration for this purpose. However, it is also possible, of course, to extend the design mentioned above, and, for example, to provide yet further detour lines to the extent that appears spatially feasible and that a further lowering of the peak powers still yields advantages.

It is also likewise conceivable to split the beam physically instead of in terms of polarization optics. When the peak power of a pulsed laser light source is reduced by half, for example by offsetting the partial beams appropriately in time, the risk of damage to members is reduced not only by half, but even by yet more. Since the peaks in the individual pulse are structured, this being a result of the resonator length in the laser, it is possible to achieve even with short delay paths that the pulse is offset within its length and the structuring is utilized appropriately, as a result of which it is possible to achieve a distinct flattening. Because of the structure of the pulses of pulsed laser light sources, it is possible in this case to reduce the power peaks clearly by even small detour lines. Of course, an optimum is achieved whenever the temporal shift due to the beam splitting is so large that peaks and valleys can respectively be assigned. This can be achieved, for example, by means of the second detour line 11. Instead of the mirrors as reflecting members, it is also possible to provide other reflecting members, such as prisms, for example.

If a $\lambda/4$ plate (not illustrated) is used to produce circularly polarized light upstream of the device, every azimuthal angle about the Z axis is possible for the beam splitter apparatuss 3 and 4.

Figure 4:
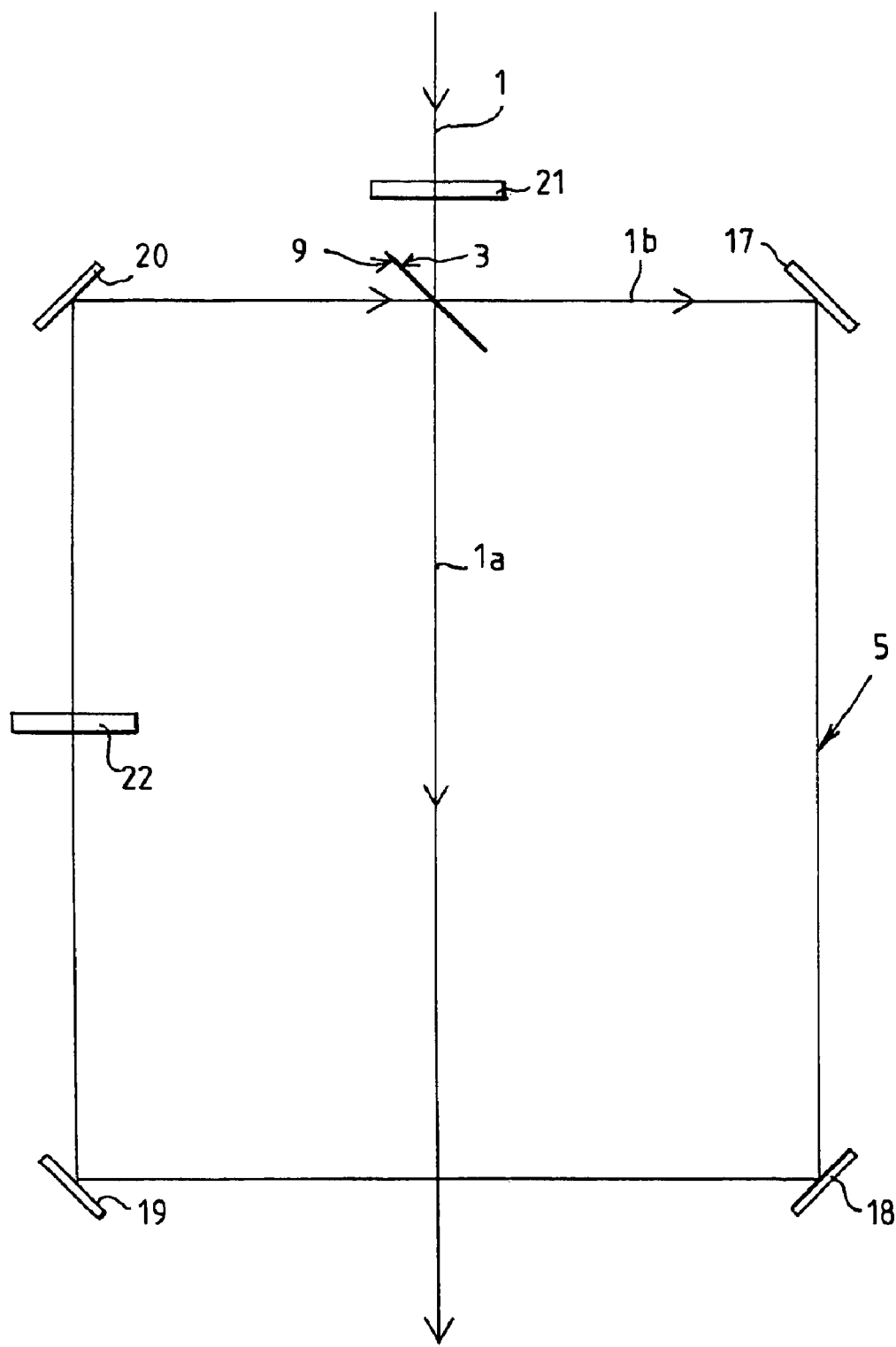
FIG. 4 shows a schematic illustration of a further embodiment of the device according to the invention.

A further embodiment of the device according to the invention is illustrated in principle in FIG. 4. As may be seen, the beam 1 is split at the beam splitter apparatus 3 into a partial beam la, which goes through the beam splitter apparatus 3 and a partial beam 1b, which takes the path via the rectangular detour line 5. The detour line 5 is formed in this case by four mirrors 17, 18, 19 and 20 before the partial beam 1b on the rear side of the beam splitter apparatus 3, which serves as beam recombining element 9 just as in the case of the exemplary embodiment according to FIG. 1, is reunited with the partial beam 1a.

By contrast with the exemplary embodiment according to FIG. 1, however, in this case there is no complete union; instead, the embodiment according to FIG. 4 is configured such that a portion of the partial beam 1b running over the detour line 5 once again takes the path via the detour path 5, it being possible for this to be carried out several times. The coupling of the beam takes place in this exemplary embodiment in the manner of a resonator, the portion of the light or partial beam 1b circulating via the detour line 5, that is to say the adjustable pulse length, being a function of the state of polarization. It is possible in this way to achieve arbitrary delays of the incoming pulses and, associated therewith, a lowering of the pulse peak energy of the pulsed laser light source. All that must be ensured in this case is that an optimum is chosen between a temporal lengthening of the partial pulses (number of the resonator circulations) and the total losses. This is achieved by the arrangement of a phase-retarding plate 21 in the beam path upstream of the beam splitter apparatus 3 and a further phase-retarding plate 22 in the detour line 1b . In this way, linearly polarized light is converted into slightly elliptically polarized light which upon traversing the beam splitter apparatus 3 is reflected out with an appropriate component. The height of the component depends in this case on the degree of the ellipse. If, for example, the phase-retarding plate 21 is equipped with a λ/4 value, an absolute value at the level of 50% is sent via the detour line 1b. In practice, λ values of between 0 and a quarter will be selected.

The configuration according to FIG. 4 with the two phase-retarding plates 21 and 22 has the advantage that the device can be adjusted very variably in this way. Specifically, if one or both phase-retarding plates 21 and/or 22 are exchanged, there is a corresponding change in the peak power. If, for example, it were desired to achieve a higher power, something which necessarily produces a higher loading and thus a shorter service life for the device, use is made of phase-retarding plates 21 and/or 22 which entail correspondingly fewer circulations. Conversely, it is possible in this way also to be kinder to the optical members of the projection exposure system by an appropriate increase in the number of circulations of the light.

Figure 5:
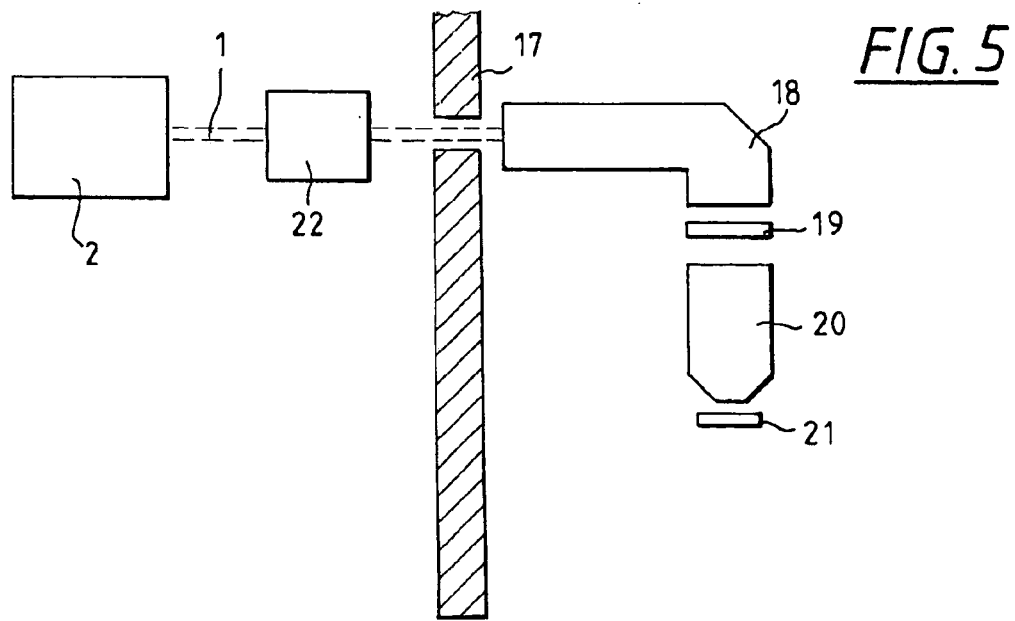
FIG. 5 shows an illustration of the principle of a projection exposure system having an excimer laser and the device according to the invention.

FIG. 5 illustrates in principle a site of use of the device 22 according to the invention. The polarized light source 2 is accordingly provided, for example, for a projection exposure system which is located in a clean room separated from the surroundings by a wall 17 and having an illuminating optical system 18, a mask 19, a projection lens 20 and a laser 21. In order to be able to influence the clean room as little as possible, in this case the device 22, which is provided in the interior with the parts illustrated in FIG. 1, can be arranged between the pulsed laser light source 2 and the wall 17 in the beam path 1 of the pulsed laser light source 2.

What is claimed is:

1. A projection exposure system, having at least one beam splitter in a beam path of a pulsed laser light source said system having reflecting components splitting a principal beam for the passage of a partial beam on at least one detour line so that a beam recombining element joins the partial beam with the principal beam to form a total beam, said beam splitter having a mirror which is arranged at angle of from 35 to 50 degrees to the beam path, and having a phase-retarding plate in the beam path upstream of the beam-splitter.

2. The system as claimed in claim 1, wherein the detour line has a length such that an optical path difference of more than 0.5 m is produced between the partial beams.

3. The system as claimed in claim 1, wherein at least three reflecting components form a detour line.

4. The system as claimed in claim 1, wherein the reflecting components are constructed as mirrors.

5. The system as claimed in claim 1, wherein two detour lines are arranged in series in the beam path.

6. The system as claimed in claim 5, wherein a first detour line has a length of over 2 m, and a second detour line has a length of over 10 m.

7. The system as claimed in claim 1, wherein the beam recombining element is constructed such that a portion of the partial beam which has run via the detour line is repeatedly sent via the detour line.

8. The system as claimed in claim 1, wherein a 10 phase-retarding plate is arranged in the beam path upstream of the beam splitter, and at least one further phase-retarding plate is arranged in the detour line.

9. The system of claim 1 wherein the mirror is arranged at the Brewster angle to the beam path.

10. A projection exposure system, having at least one beam splitter in a beam path of a pulsed laser light source said system having reflecting components splitting a principal beam for the passage of a partial beam on at least one detour line so that a beam recombining element joins the partial beam with the principal beam to form a total beam, said beam splitter having a mirror which is arranged at an angle to the beam path, said detour line having an easily detuned keppler telescope positioned therein, said system further having a phase-retarding plate in the beam path upstream of the beam splitter.

11. The system as claimed in claim 10, wherein the detour line has a length such that an optical path difference of more than 0.5 m is produced between the partial beams.

12. The system as claimed in claim 10, wherein at least three reflecting components form a detour line.

13. The system as claimed in claim 10, wherein the angle is between 35 and 50°.

14. The system as claimed in claim 13, wherein the Brewster angle is provided as the angle.

15. The system as claimed in claim 10, wherein the reflecting components are constructed as mirrors.

16. The system as claimed in claim 10, wherein two detour lines are arranged in series in the beam path.

17. The system as claimed in claim 16, wherein a first detour line has a length of over 2 m, and a second detour line has a length of over 10 m.

18. The system as claimed in claim 10, wherein the beam recombining element is constructed such that a portion of the partial beam which has run via the detour line is repeatedly sent via the detour line.

19. The system as claimed in claim 10, wherein a 10 phase-retarding plate is arranged in the beam path upstream of the beam splitter, and at least one further phase-retarding plate is arranged in the detour line.

20. The system of claim 10 wherein the mirror is arranged at the Brewster angle to the beam path.

21. A projection exposure system, having at least one beam splitter in a beam path of a pulsed laser light source said system having reflecting components splitting a principal beam for the passage of a partial beam on at least one detour line so that a beam recombining element joins the partial beam with the principal beam to form a total beam, said beam splitter having a mirror which is arranged at an angle of from 35° to 50° to the beam path, said detour line having an easily detuned keppler telescope positioned therein, and said systemn having a phase-retarding plate in the beam path upstream of the beam splitter.

22. The system as claimed in claim 21, wherein the detour line has a length such that an optical path difference of more than 0.5 m is produced between the partial beams.

23. The system as claimed in claim 21, wherein at least three reflecting components form a detour line.

24. The system as claimed in claim 21, wherein the reflecting components are constructed as mirrors.

25. The system as claimed in claim 21, wherein two detour lines are arranged in series in the beam path.

26. The system as claimed in claim 25, wherein a first detour line has a length of over 2 m, and a second detour line has a length of over 10 m.

27. The system as claimed in claim 25, wherein the beam recombining element is constructed such that a portion of the partial beam which has run via the detour line is repeatedly sent via the detour line.

28. The system as claimed in claim 21, wherein a 10 phase-retarding plate is arranged in the beam path upstream of the beam splitter, and at least one further phase-retarding plate is arranged in the detour line.

29. The system of claim 21 wherein the mirror is arranged at the Brewster angle to the beam path.

30. A projection exposure system, having at least one beam splitter in a beam path of a pulsed laser light source said system having reflecting components splitting a principal beam for the passage of a partial beam on at least one detour line so that a beam recombining element joins the partial beam with the principal beam to form a total beam, said beam splitter having a mirror which is arranged at an angle of from 35° to 50° to the beam path, said detour line having an easily detuned keppler telescope positioned therein, and of such a length that an optical path difference of more than 0.5 m. is produced between the partial beams, and having a phase-retarding plate in the beam path upstream of the beam splitter.

31. The system as claimed in claim 30, wherein at least three reflecting components form a detour line.

32. The system as claimed in claim 30, wherein the reflecting components are constructed as mirrors.

33. The system as claimed in claim 30, wherein two detour lines are arranged in series in the beam path.

34. The system as claimed in claim 30, wherein a first detour line has a length of over 2 m, and a second detour line has a length of over 10 m.

35. The system as claimed in claim 30, wherein the beam recombining element is constructed such that a portion of the partial beam which has run via the detour line is repeatedly sent via the detour line.

36. The system as claimed in claim 30, wherein a 10 phase-retarding plate is arranged in the beam path upstream of the beam splitter, and at least one further phase-retarding plate is arranged in the detour line.

37. The system of claim 30 wherein the mirror is arranged at the Brewster angle to the beam path.

38. A projection exposure system, having at least one beam splitter in a beam path of a pulsed laser light source said system having reflecting components splitting a principal beam for the passage of a partial beam on a first detour line having a length of over 2 m and a second detour line having a length of over 10 m, so that a beam recombining element joins the partial beam with the principal beam to form a total beam, said beam splitter having a mirror which is arranged at an angle of from 35° to 50° to the beam path, and having a phase-retarding plate in the beam path upstream of the beam splitter.

39. The system of claim 38 wherein the mirror is arranged at the Brewster angle to the beam path.

40. The system as claimed in claim 38, wherein the detour line has a length such that an optical path difference of more than 0.5 m is produced between the partial beams.

41. The system as claimed in claim 38, wherein at least three reflecting components form a detour line.

42. The system as claimed in claim 38, wherein the reflecting components are constructed as mirrors.

43. The system as claimed in claim 38, wherein the beam recombining element is constructed such that a portion of the partial beam which has run via the detour line is repeatedly sent via the detour line.

44. The system as claimed in claim 38, wherein a 10 phase-retarding plate is arranged in the beam path upstream of the beam splitter, and at least one further phase-retarding plate is arranged in the detour line.

* * * * *

UNITED STATES PATENT AND TRADEMARK OFFICE
CERTIFICATE OF CORRECTION

| | | |
|---|---|---|
| PATENT NO. | : 6,996,141 B2 | Page 1 of 1 |
| APPLICATION NO. | : 09/588261 | |
| DATED | : February 7, 2006 | |
| INVENTOR(S) | : Schuster | |

It is certified that error appears in the above-identified patent and that said Letters Patent is hereby corrected as shown below:

On the Title Page Item (75)

Please delete the inventors Harry Bauer and Eric Eva.

Column 4, Line 34

Please delete "... aparatuss 3 ..." and insert --... apparatus 3 ...--

Column 5, Line 38

Please delete "... is arranged at angle ..." and insert --... is arranged at an angle ...--

Column 6, Line 42

Please delete "... said systemn having ..." and insert --... said system having ...--

Signed and Sealed this

Eighteenth Day of August, 2009

David J. Kappos
*Director of the United States Patent and Trademark Office*